United States Patent
Nojima et al.

(10) Patent No.: US 11,749,785 B2
(45) Date of Patent: Sep. 5, 2023

(54) RESIN COMPOSITION, WAVELENGTH CONVERSION MATERIAL, WAVELENGTH CONVERSION FILM, LED DEVICE, BACKLIGHT UNIT, AND IMAGE DISPLAY APPARATUS

(71) Applicant: SHIN-ETSU CHEMICAL CO., LTD., Tokyo (JP)

(72) Inventors: Yoshihiro Nojima, Annaka (JP); Shinji Aoki, Annaka (JP); Kazuya Tobishima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/285,781

(22) PCT Filed: Oct. 15, 2019

(86) PCT No.: PCT/JP2019/040395
§ 371 (c)(1),
(2) Date: Apr. 15, 2021

(87) PCT Pub. No.: WO2020/095629
PCT Pub. Date: May 14, 2020

(65) Prior Publication Data
US 2021/0384385 A1     Dec. 9, 2021

(30) Foreign Application Priority Data
Nov. 6, 2018   (JP) .................................. 2018-208966

(51) Int. Cl.
| | |
|---|---|
| *H01L 33/50* | (2010.01) |
| *G02F 1/1335* | (2006.01) |
| *C08L 27/12* | (2006.01) |
| *C09K 11/56* | (2006.01) |
| *C09K 11/70* | (2006.01) |
| *C09K 11/88* | (2006.01) |
| *G02F 1/13357* | (2006.01) |
| *B82Y 20/00* | (2011.01) |
| *B82Y 30/00* | (2011.01) |
| *B82Y 40/00* | (2011.01) |

(52) U.S. Cl.
CPC ............ *H01L 33/502* (2013.01); *C08L 27/12* (2013.01); *C09K 11/56* (2013.01); *C09K 11/70* (2013.01); *C09K 11/883* (2013.01); *G02F 1/133602* (2013.01); *G02F 1/133614* (2021.01); *B82Y 20/00* (2013.01); *B82Y 30/00* (2013.01); *B82Y 40/00* (2013.01); *C08L 2203/20* (2013.01)

(58) Field of Classification Search
CPC ..... H01L 33/502; H01L 33/501; H01L 33/50; C08L 27/12; C08L 2203/20; C08L 33/14; C08L 101/00; C09K 11/56; C09K 11/70; C09K 11/883; G02F 1/133602; G02F 1/133614; B82Y 20/00; B82Y 30/00; B82Y 40/00; C08K 2201/001; C08K 2201/011; C08K 3/08; C08K 3/013; F21V 9/30; G02B 5/20
See application file for complete search history.

(56) References Cited

U.S. PATENT DOCUMENTS

| | | | |
|---|---|---|---|
| 6,501,091 B1 | 12/2002 | Bawendi et al. | |
| 2002/0173568 A1* | 11/2002 | Lensvelt ................. | C08L 79/08 524/154 |
| 2007/0229736 A1* | 10/2007 | Wang ................ | G02F 1/133603 349/106 |
| 2012/0113672 A1 | 5/2012 | Dubrow et al. | |
| 2012/0138874 A1* | 6/2012 | Yuan ...................... | G02B 6/005 252/301.36 |
| 2012/0301971 A1 | 11/2012 | Murase et al. | |
| 2014/0030507 A1 | 1/2014 | Yoshida et al. | |
| 2014/0361281 A1* | 12/2014 | Carroll ............... | H01L 51/5028 257/40 |
| 2017/0320306 A1 | 11/2017 | Iwase | |
| 2018/0105658 A1* | 4/2018 | Cho .................. | G02F 1/133603 |
| 2018/0208835 A1 | 7/2018 | Armstrong et al. | |
| 2019/0031954 A1* | 1/2019 | Okura ................... | H01L 33/507 |

FOREIGN PATENT DOCUMENTS

| | | |
|---|---|---|
| JP | 2002-510866 A | 4/2002 |
| JP | 2013-544018 A | 12/2013 |
| JP | 5900720 B1 | 4/2016 |
| JP | 2016-141050 A | 8/2016 |
| JP | 2018-528302 A | 9/2018 |
| WO | WO-2006072782 A2 * 7/2006 ............. C08K 5/315 |
| WO | 2011/081037 A1 | 7/2011 |
| WO | 2012/132239 A1 | 10/2012 |

OTHER PUBLICATIONS

May 11, 2021 International Preliminary Report on Patentability issued in International Application No. PCT/JP2019/040395.
Dec. 3, 2019 Search Report issued in International Patent Application No. PCT/JP2019/040395.
Aug. 10, 2021 Office Action issued in Japanese Patent Application No. 2018-208966.
Jun. 6, 2022 Office Action issued in Chinese Patent Application No. 201980072442.8.
Dec. 12, 2022 Office Action issued in Chinese Patent Application No. 201980072442.8.

* cited by examiner

*Primary Examiner* — Donald L Raleigh
(74) *Attorney, Agent, or Firm* — Oliff PLC

(57) ABSTRACT

A resin composition containing a base resin and quantum dots that are crystalline nanoparticle phosphors, the base resin containing a fluorine-containing resin. This provides a resin composition capable of enhancing the stability of quantum dots.

15 Claims, No Drawings

RESIN COMPOSITION, WAVELENGTH CONVERSION MATERIAL, WAVELENGTH CONVERSION FILM, LED DEVICE, BACKLIGHT UNIT, AND IMAGE DISPLAY APPARATUS

TECHNICAL FIELD

The present invention relates to: a resin composition containing quantum dots; and a wavelength conversion material, a wavelength conversion film, a backlight unit, and an image display apparatus which utilize the resin composition.

BACKGROUND ART

Semiconductor crystal particles with nanosized particle diameters are called quantum dots. Excitons generated upon light absorption are confined in a nanosized region, so that the semiconductor crystal particles have discrete energy levels, while the band gap varies depending on the particle diameter. Due to these effects, the fluorescence by quantum dots is brighter and more efficient than those by common fluorescent materials and exhibits sharp emission-wavelength distribution.

Moreover, based on such nature that the band gap varies depending on the particle diameter, quantum dots are characterized in that the emission wavelength is controllable. The applications as wavelength conversion materials for solid-state lighting and displays are expected. For example, the use of quantum dots as a wavelength conversion material in a display enables wider color gamut and lower power consumption than conventional phosphor materials.

As an implementation method of quantum dots for use as a wavelength conversion material, Patent Document 1 has proposed a method in which quantum dots are dispersed in a resin material, and the resin material containing the quantum dots is laminated with a transparent film and then incorporated as a wavelength conversion film into a backlight unit.

Further, the use of quantum dots as a wavelength conversion material for LED enables higher color-rendering properties and lower power consumption than conventional phosphor materials. As an implementation method of quantum dots for use as a wavelength conversion material, a method has been reported in which a phosphor layer containing quantum dots and a blue LED are combined as an LED device to be used in a display and solid-state lighting (Patent Document 2).

CITATION LIST

Patent Literature

Patent Document 1: JP 2013-544018 A
Patent Document 2: JP 2002-510866 A
Patent Document 3: WO 2011-081037 A1
Patent Document 4: JP 5900720 B1

SUMMARY OF INVENTION

Technical Problem

However, since quantum dots have particle diameters as small as nanometer size, the specific surface area is large. Hence, the surface energy is so high that the surfaces are highly active and likely to become unstable. Surface defects are likely to occur by dangling bonds, oxidation reaction, or the like on the surfaces of quantum dots, and may degrade the fluorescence properties. These are particularly problems of cadmium-free quantum dots and perovskite-type quantum dots. Currently-available quantum dots have such stability problems that the luminous properties are degraded and adversely influenced by heat, humidity, light excitation, etc.

Over-time changes in the luminous properties of quantum dots result in defects such as uneven colors, uneven light emission, and dead pixels on a display. Hence, quantum dot stability is important problem.

Against such problems, there have been proposed: a method in which quantum-dot surfaces are coated with a polymer, inorganic oxide, or the like (Patent Document 3); and a method in which a gas-barrier film with low oxygen- and humidity-permeability is used to enhance the quantum dot stability (Patent Document 4).

However, in the step of coating quantum-dot surfaces to enhance the stability as described in Patent Document 3, the luminous properties of the quantum dots cannot be maintained, which results in a problem of degrading the properties.

Additionally, the stabilization with a barrier film as described in Patent Document 4 also has a problem that the degradation progresses due to diffusion of oxygen and water vapor from film end surface. Further, although thin wavelength conversion films are demanded for mobile applications such as tablets and smartphones, when both surfaces of a film is protected, the resulting thickness is as large as at least 40 μm or more because typical barrier films have thicknesses of approximately 20 to 200 μm. Hence, there is a limit to the formation of thin wavelength conversion films.

The present invention has been made to solve the above-described problems. An object of the present invention is to provide a resin composition capable of enhancing the stability of quantum dots. Another object is to provide: a wavelength conversion material and a wavelength conversion film which use the resin composition; as well as a backlight unit and an image display apparatus which use the wavelength conversion film.

Solution to Problem

The present invention has been made to achieve the objects, and provides a resin composition comprising a base resin and quantum dots that are crystalline nanoparticle phosphors, wherein
the base resin comprises a fluorine-containing resin.

With such a resin composition, the stability of the quantum dots is dramatically enhanced.

In this resin composition, the fluorine-containing resin may be at least one selected from fluoropolymers, fluorinated cyclic compounds, and fluorinated copolymers.

Moreover, the resin composition may be such that the fluorine-containing resin has at least one structural unit selected from the following general formulae 1 to 7:

  (1);

  (2)

where R represents a perfluoroalkyl group;

  (3);

(—CF$_2$—CF(CF$_3$)—)  (4);

  (5);

(—CF$_2$—CHF—)  (6); and

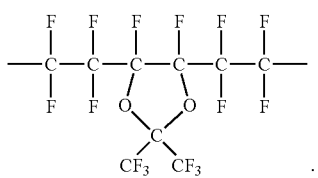

(7)

Thus, the quantum dots have more enhanced stability.

In this case, the resin composition may be such that: the fluorine-containing resin is a copolymer having at least one structural unit selected from the general formulae 1 to 7, and the copolymer is any of a block copolymer, an alternating copolymer, a random copolymer, and a graft copolymer.

Thus, the quantum dots have further enhanced stability.

In this resin composition, the fluorine-containing resin may be a polymer selected from polytetrafluoroethylene, perfluoroalkoxy alkane, polyvinylidene fluoride, polyvinyl fluoride, tetrafluoroethylene-perfluoropropylene copolymer, tetrafluoroethylene-perfluoroalkyl vinyl ether copolymer, fluoroethylene-vinyl ether copolymer, polychlorotrifluoroethylene, chlorotrifluoroethylene-ethylene copolymer, fluoroolefin-acrylic acid ester copolymer, tetrafluoroethylene-perfluorodioxole copolymer, and derivatives thereof.

Thus, the quantum dots have furthermore enhanced stability.

In this resin composition, the base resin may further comprise a fluorine-free resin. In a more preferable resin composition, the fluorine-free resin includes at least one or more resins selected from an acrylic resin, an epoxy resin, a silicone resin, a urethane resin, and a polyimide resin.

These facilitate setting of the properties of a product molded from the resin composition, and broaden the applicable range.

Here, a wavelength conversion material can be formed from any one of the above-described resin compositions. Further, a wavelength conversion material for LED can also be formed.

Thus, the wavelength conversion materials have little variation in properties and excellent stability.

Here can be provided a wavelength conversion film comprising a wavelength conversion layer formed from any one of the above-described resin compositions.

Such wavelength conversion films have little variation in properties and excellent stability.

Here, in a wavelength conversion film comprising a wavelength conversion layer formed from the resin composition, the fluorine-containing resin and the fluorine-free resin may be phase-separated at least partially.

This makes it possible to enhance the coatability, for example, enhance the adhesiveness when this resin-processed product is applied. Moreover, cost down can be expected by reducing the use amount of the fluorine-containing resin.

In this case, the wavelength conversion film may comprise a single layer of the wavelength conversion layer.

This allows further film thickness reduction, which is particularly suitable for mobile applications, etc.

Here, the wavelength conversion film may have a laminate structure comprising the wavelength conversion layer and transparent films on both sides of the wavelength conversion layer.

Thus, the film has such properties as enhanced strength, surface protection, light diffusion, etc.

Here, the wavelength conversion film can be for LED.

This enables production of an LED device having stable luminous properties.

Here can be provided an LED device comprising the wavelength conversion material for LED or the wavelength conversion film for LED.

Thus, such LED device has stable luminous properties.

Here can be provided a backlight unit comprising any one of the wavelength conversion films or the LED device.

Such backlight units have little variation in properties and excellent stability.

Here can be provided an image display apparatus comprising any one of the wavelength conversion films.

Such image display apparatuses have little variation in properties and excellent stability.

Advantageous Effects of Invention

As described above, the resin composition of the present invention enables dramatic enhancement of quantum dot stability.

DESCRIPTION OF EMBODIMENTS

The present invention will be described below, but the present invention is not limited to the following.

As described above, there has been desired a resin composition capable of enhancing the stability of quantum dots to have enhanced reliability.

The present inventors have earnestly studied the above-described problems and consequently found that the stability of quantum dots can be dramatically enhanced with a resin composition containing the quantum dots serving as a crystalline nanoparticle phosphor and a base resin including a fluorine-containing resin. This finding has led to the completion of the present invention.

Hereinafter, the present invention will be described in detail.

(Resin Composition)

First, a resin composition according to the present invention will be described. The inventive resin composition contains a base resin and quantum dots that are crystalline nanoparticle phosphors, and is characterized by incorporating a fluorine-containing resin in the base resin. The present inventors have found that incorporating a fluorine-containing resin in the base resin dramatically enhances the stability of the quantum dots.

Hereinbelow, each material contained in the inventive resin composition will be described.

(Quantum Dot)

First, description will be given of quantum dots contained in the inventive resin composition.

The quantum dots are crystalline nanoparticle phosphors, and the type and composition thereof are not particularly limited. The quantum dots can be selected in accordance with the properties and design of the target product. For example, it is possible to adopt group II-IV semiconductors, group III-V semiconductors, group II-VI semiconductors, group semiconductors, group II-IV-V semiconductors, group IV semiconductors, perovskite-type semiconductors, etc.

Specific examples include CdSe, CdS, CdTe, InP, InAs, InSb, AlP, AlAs, AlSb, ZnSe, ZnS, ZnTe, $Zn_3P_2$, GaP, GaAs, GaSb, $CuInSe_2$, $CuInS_2$, $CuInTe_2$, $CuGaSe_2$, $CuGaS_2$, $CuGaTe_2$, $CuAlSe_2$, $CuAlS_2$, $CuAlTe_2$, $AgInSe_2$, $AgInS_2$, AgInTe, AgGaSe$_2$, AgGaS$_2$, AgGaTe$_2$, PbSe, PbS, PbTe, Si, Ge, graphene, CsPbCl$_3$, CsPbBr$_3$, CsPbI$_3$, CH$_3$NH$_3$PbCl$_3$, mixed crystals thereof, and these materials doped with dopants.

The structure of the quantum dots is not limited; for example, each quantum dot may have only a core or may have a core-shell structure. Moreover, the quantum dots may be spherical, cubic, or rod shaped, for example. Any shape is adoptable.

The average particle diameter of the quantum dots can be appropriately set in accordance with the intended use of the resin composition. For example, the average particle diameter can be selected depending on the wavelength range as a phosphor. The quantum dots preferably have an average particle diameter of, for example, 100 nm or less, preferably 20 nm or less. With the average particle diameter in such a range, the dispersibility in the resin is enhanced, so that enhanced light transmittance, aggregation-suppressing effect, and so forth can be expected. Further, the quantum size effect becomes more effective. For example, the luminous efficiency enhancement can be expected, and the band gap is also easily controlled through particle diameter adjustment.

Note that, the average particle diameter of the quantum dots can be calculated from an average value of maximum diameters in a specified direction, that is, Feret diameters, of 20 particles or more which are measured from a particle image taken with a transmission electron microscope (TEM). It is a matter of course that the measurement method of the average particle diameter is not limited thereto, and the measurement can be performed by other methods.

Further, each quantum dot may have, on its surface, a coating layer of organic molecules, inorganic molecules, or polymer. The structure of the coating layer is not limited. Moreover, the thickness of the coating layer can be appropriately set in accordance with the target properties. For example, a coating layer can be formed to have a thickness within such a range that the average particle diameter of the quantum dots is approximately 100 nm or less.

For example, the coating layer can be made of: organic molecules, such as stearic acid, oleic acid, palmitic acid, dimercaptosuccinic acid, oleylamine, hexadecylamine, octadecylamine, or 1-dodecanethiol; a polymer, such as polyvinyl alcohol, polyvinyl pyrrolidone, polysilsesquioxane, poly (methyl methacrylate), polyacrylonitrile, or polyethylene glycol; or inorganic molecules, such as silica, alumina, titania, zirconia, zinc oxide, gallium oxide, silicon nitride, or gallium nitride.

The amount (concentration) of the quantum dots contained in the resin composition is not particularly limited. The amount can be set appropriately depending on the thickness of a wavelength conversion film, the luminous efficiency of the quantum dots, and target properties of the film.

(Base Resin)

Next, the base resin contained in the inventive resin composition will be described. The base resin is characterized by incorporating a fluorine-containing resin. This enables enhancement of the stability of the quantum dots contained in the resin composition. Note that, in this description, the term "base resin" means a resin component of the resin composition, excluding the quantum dots and an additive(s).

The fluorine-containing resin is preferably at least one selected from fluoropolymers, fluorinated cyclic compounds, and fluorinated copolymers. Additionally, the polymerization degree and the proportion of these present are not particularly limited. The polymerization degree and the proportion can be set appropriately depending on the target resin properties, such as viscosity and hardness.

Moreover, the fluorine-containing resin preferably has at least one structural unit selected from the following general formulae 1 to 7:

$(-CF_2-CF_2-)$ (1);

$(-CF_2-CF(O-R)-)$ (2), where R represents a perfluoroalkyl group;

$(-CF_2-CFCl-)$ (3);

$(-CF_2-CF(CF_3)-)$ (4);

$(-CF_2-CF_2-)$ (5);

$(-CF_2-CHF-)$ (6); and

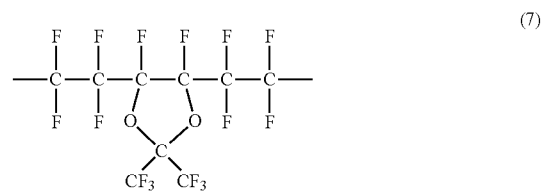 [SMILES: CC(F)(F)C(F)(F)C1(F)OC(C(F)(F)F)(C(F)(F)F)OC1(F)C(F)(F)C(C)(F)F]

(7)

Besides the structural units of the general formulae 1 to 7, the fluorine-containing resin may have another structural unit without particular limitation to the type. This additional structural unit can be set appropriately depending on the target resin properties. Moreover, examples of the structural unit other than the structural units of the general formulae 1 to 7 include vinyl alcohol, vinyl ether, vinyl ester, acrylic acid ester, methacrylic acid ester, acrylamide, urethane, styrene, ethylene, vinyl acetate, vinyl halide, vinylidene halide, acrylonitrile, vinyl alkyl ether, organosiloxane, etc. It is needless to say that the examples are not limited thereto.

Further, the proportion of the structural units of the general formulae 1 to 7 present in the fluorine-containing resin is not particularly limited, either.

The fluorine-containing resin is preferably a copolymer having at least one structural unit selected from the general formulae 1 to 7. The copolymer is preferably any of a block copolymer, an alternating copolymer, a random copolymer, and a graft copolymer.

The fluorine-containing resin can be a polymer selected from polytetrafluoroethylene (PTFE), perfluoroalkoxy alkane (PFA), polyvinylidene fluoride (PVDF), polyvinyl fluoride, tetrafluoroethylene-ethylene copolymer, tetrafluoroethylene-perfluoropropylene copolymer, tetrafluoroethylene-perfluoroalkyl vinyl ether copolymer, fluoroethylene-vinyl ether copolymer, polychlorotrifluoroethylene (PCTFE), chlorotrifluoroethylene-ethylene copolymer, fluoroolefin-acrylic acid ester copolymer, tetrafluoroethylene-perfluorodioxole copolymer, and derivatives thereof. With these polymers, a film prepared from the resin composition has excellent gas barrier properties, processability, etc.

Further, the base resin can also contain a resin other than the fluorine-containing resin. Examples of usable resin other than the fluorine-containing resin include at least one or more resins selected from an acrylic resin, an epoxy resin, a silicone resin, a urethane resin, and a polyimide resin. These make it easy to set, for example, mechanical properties, including flexibility and strength, when the inventive resin composition is applied as a wavelength conversion material or wavelength conversion film, so that the applicable range is widened.

Note that the amount of the fluorine-containing resin contained in the base resin is not particularly limited. The amount is preferably 1 mass % or more, more preferably 10 mass % or more, relative to the total amount of the base resin. With the amount of 30 mass % or more, the stability of the quantum dots can be enhanced more surely. The upper limit value is 100 mass %, but can be 90% or less, further preferably 50% or less. Since the fluorine-containing resin is relatively expensive, cost reduction can be expected by reducing the content. In addition, enhancements of coatability, such as wettability and adhesiveness, can be expected.

(Other Additive)

The inventive resin composition can contain, as an additive, a material other than the base resin that contains the fluorine-containing resin and the quantum dots serving as a crystalline nanoparticle phosphor. For example, it is possible to incorporate fine particles, such as silica, zirconia, alumina, or titania, which function as a light scatterer. Moreover, an inorganic phosphor or an organic phosphor may be incorporated. Examples of the inorganic phosphor include YAG, LSN, LYSN, CASN, SCASN, KSF, CSO, β-SIALON, GYAG, LuAG, and SBCA. Examples of the organic phosphor include perylene derivatives, anthraquinone derivatives, anthracene derivatives, phthalocyanine derivatives, cyanine derivatives, dioxazine derivatives, benzoxazinone derivatives, coumarin derivatives, quinophthalone derivatives, benzoxazole derivatives, pyralizone derivatives, etc.

(Method for Producing Resin Composition)

The inventive resin composition can be produced by mixing quantum dots and a base resin optionally with other additive(s). The method for mixing these is not particularly limited, and can be selected appropriately depending on the nature of the base resin to be employed and the properties thereof in the target usage. For example, a base resin dissolved in a solvent may be mixed with a solution in which quantum dots are dispersed. Alternatively, to flakes of a base resin, a quantum-dot solution or a quantum-dot solid collected from a quantum-dot solution by centrifugation or the like may be added and kneaded. The quantum dots and the base resin do not always have to be uniformly dispersed. Meanwhile, in the case where the base resin contains a fluorine-free resin, the fluorine-containing resin and the fluorine-free resin may be partially phase-separated. In this case, for example, the wettability and adhesiveness can be enhanced when the resin composition is applied; thus, the coatability can be enhanced. Moreover, cost down can be expected through reduction of the amount of the fluorine-containing resin used.

(Wavelength Conversion Material)

A wavelength conversion material can be obtained from the inventive resin composition. This wavelength conversion material is excellent in the stability of the quantum dots, and accordingly has little variation in properties. The form of the wavelength conversion material is not particularly limited. The wavelength conversion material can have various shapes, such as bulky shape, plate, sheet, and film. The wavelength conversion material can be obtained by an appropriate production method in accordance with the form. For example, it is possible to employ a solution cast method, a solution casting method, a melt-extrusion molding method, a cast molding method, an injection molding method, an additive manufacturing method, etc.

(Wavelength Conversion Film)

Preferably, a wavelength conversion layer is formed from the inventive resin composition to prepare a wavelength conversion film containing the wavelength conversion layer. In this case, the thickness of the wavelength conversion film is not particularly limited, and can be designed appropriately in accordance with the purpose. The wavelength conversion film has a thickness of preferably, for example, approximately 5 to 500 μm, more preferably 200 μm or less, further preferably 100 μm or less. With such ranges, more stable luminous properties can be obtained.

Moreover, the structure of the wavelength conversion film is not particularly limited, either. For example, the film may consist of a single layer of the wavelength conversion layer. Further film thickness reduction can be achieved by such monolayer film, which is particularly suitable for mobile applications, etc.

Further, it is possible to adopt a laminate structure including three or more layers in which the wavelength conversion layer is sandwiched by functional films, or a laminate structure including two or more layers in which the wavelength conversion layer is applied on a base film. Such laminate structures can provide such functions as enhanced strength, surface protection, light diffusion, etc. A transparent film may be used as the functional film or the base film; examples of the transparent film include PET, PP, PE, etc. In this event, an adhesion layer may be present between the transparent film and the wavelength conversion layer. Furthermore, a surface treatment is preferably performed with a silane coupling agent or the like to enhance the adhesiveness between the wavelength conversion layer and the base film or the functional film.

Note that the wavelength conversion layer can be produced by an appropriate production method in accordance with the nature of the resin composition and the target properties of the wavelength conversion film. Examples of the production method include a solution cast method, a solution casting method, a melt-extrusion molding method, etc. The produced wavelength conversion layer may be used as a monolayer wavelength conversion film as described above, or may be stacked on another film or the like to prepare a wavelength conversion film.

Moreover, suitable applications of the wavelength conversion material and the wavelength conversion film according to the present invention include, for example, an LED, a backlight unit installed on a surface of a light guide panel to which a blue LED is coupled, and an image display apparatus disposed between the light guide panel surface and a liquid-crystal display panel. The wavelength conversion film absorbs at least a portion of primary light from a light source, and emits secondary light having a longer wavelength than the primary light, for example, so that the light can be converted to light having a certain wavelength distribution depending on the emission wavelength of the quantum dots. In the wavelength conversion film according to the present invention, the stability of the quantum dots is dramatically enhanced, so that the backlight unit and the image display apparatus are expected to have longer lifetime.

EXAMPLE

Hereinafter, the present invention will be described in detail by showing Examples and Comparative Examples, but the present invention is not limited thereto.

Example 1

Quantum dots used were: InP/ZnSe/ZnS core-shell quantum dots having spherical shape, an average particle diameter of 6 nm, and an emission wavelength of 531 nm (hereinafter referred to as "QD-G"); and InP/ZnSe/ZnS core-shell quantum dots having spherical shape, an average particle diameter of 8 nm, and an emission wavelength of 627 nm (hereinafter referred to as "QD-R"). A solution was prepared in which both types of the quantum dots were dispersed at 20 mass % in toluene solution (hereinafter referred to as "quantum-dot solution").

First, to the quantum-dot solution, acetone was added such that the volume was five times as large as that of the quantum-dot solution. The precipitated quantum dots were subjected to a centrifugation treatment with a centrifuge at 10000 rpm for 10 minutes. Thus, a quantum-dot paste was obtained.

Next, this quantum-dot paste was added to a base resin ETFE (manufactured by AGC Inc.: C-88AXP) such that each of QD-G and QD-R accounted for 3% by mass. Thus, a resin composition was obtained. Then, the resin composition was introduced into a single-screw extruder for kneading, then extruded from a T-die under a condition of 300° C., passed through rollers, and cooled and solidified. Thus, a wavelength conversion film was formed. The obtained wavelength conversion film had a thickness of 73 µm.

Example 2

The quantum-dot paste was obtained as in Example 1. Next, this quantum-dot paste was added to a base resin PFA (manufactured by Daikin Industries, Ltd.: POLYFLON PFA AP-202) such that each of QD-G and QD-R accounted for 3% by mass. Thus, a resin composition was obtained. Then, the resin composition was introduced into a single-screw extruder for kneading, then extruded from a T-die under a condition of 320° C., passed through rollers, and cooled and solidified. Thus, a wavelength conversion film was formed. The obtained wavelength conversion film had a thickness of 83 µm.

Example 3

The quantum-dot paste was obtained as in Example 1. Next, this quantum-dot paste was added to a base resin PCTFE (manufactured by Daikin Industries, Ltd.: NEOFLON PCTFE M-300P) such that each of QD-G and QD-R accounted for 3% by mass. Thus, a resin composition was obtained. Then, the resin composition was introduced into a single-screw extruder for kneading, then extruded from a T-die under a condition of 290° C., passed through rollers, and cooled and solidified. Thus, a wavelength conversion film was formed. The obtained wavelength conversion film had a thickness of 112 µm.

Example 4

The quantum-dot paste was obtained as in Example 1. Next, this quantum-dot paste was added to a base resin PVDF (manufactured by Arkema Inc.: KYNAR 740) such that each of QD-G and QD-R accounted for 3% by mass. Thus, a resin composition was obtained. Then, the resin composition was introduced into a single-screw extruder for kneading, then extruded from a T-die under a condition of 220° C., passed through rollers, and cooled and solidified. Thus, a wavelength conversion film was formed. The obtained wavelength conversion film had a thickness of 46 µm.

Example 5

PVDF (manufactured by Arkema Inc.: KYNAR 740) was dissolved in DMF (manufactured by Kanto Chemical Co., Inc.) such that the solid concentration was 20 mass %. Thereby, a base resin solution was obtained.

Next, the quantum-dot solution was added and mixed with the base resin solution such that each of QD-G and QD-R accounted for 3% by mass of the resin solid content. Thus, a resin composition was obtained.

Next, the resin composition was defoamed by stirring, applied onto a 25-µm PET film (manufactured by Toray Industries Inc.: LUMIRROR film T60) using a bar coater, and solidified by heating with an oven at 80° C. for 30 minutes. Thus, a laminate film having a wavelength conversion layer was formed. Further, a PET film was laminated on the wavelength conversion layer. The resulting film was cured by heating at 85° C. for 1 hour. Thus, a laminate was obtained as a wavelength conversion film.

In the obtained wavelength conversion film, the wavelength conversion layer had a thickness of 109 µm, and the wavelength conversion film as a whole had a thickness of 159 µm.

Example 6

The quantum-dot solution was added and mixed with a xylene solution containing 40% fluoroethylene-vinyl ether copolymer (manufactured by AGC Inc.: LUMIFLON LF200) as a base resin solution such that each of QD-G and QD-R accounted for 2% by mass of the resin solid content. Thus, a resin composition was obtained.

Next, the resin composition was defoamed by stirring, applied onto a 25-µm PET film (manufactured by Toray Industries Inc.: LUMIRROR film T60) using a bar coater, and cured by heating with an oven at 80° C. for 1 hour. Thus, a laminate having a wavelength conversion layer was obtained as a wavelength conversion film.

In the obtained wavelength conversion film, the wavelength conversion layer had a thickness of 72 µm, and the wavelength conversion film as a whole had a thickness of 97 µm.

Example 7

The quantum-dot solution was added and mixed with a xylene solution containing 40% fluoroethylene-vinyl ether copolymer (manufactured by AGC Inc.: LUMIFLON LF200) as a base resin solution such that each of QD-G and QD-R accounted for 2% by mass of the resin solid content. Thus, a mixture solution was obtained.

Next, to the mixture solution, silica particles (QSG-30 manufactured by Shin-Etsu Chemical Co.) having an average particle size of 30 µm were added in an amount which accounted for 5% mass of the mixture solution, and the silica particles were dispersed therein. Thus, a resin composition containing the quantum dots, the base resin, and the silica particles was obtained.

Next, the resin composition was defoamed by stirring, applied onto a 25-µm PET film (manufactured by Toray Industries Inc.: LUMIRROR film T60) using a bar coater, and cured by heating with an oven at 80° C. for 1 hour. Thus, a laminate having a wavelength conversion layer was obtained as a wavelength conversion film.

In the obtained wavelength conversion film, the wavelength conversion layer had a thickness of 77 µm, and the wavelength conversion film as a whole had a thickness of 102 µm.

Example 8

The quantum-dot solution was added and mixed with a xylene solution containing 40% fluoroethylene-vinyl ether copolymer (manufactured by AGC Inc.: LUMIFLON LF200) as a base resin solution such that each of QD-G and QD-R accounted for 2% by mass of the resin solid content. Thus, a mixture solution was obtained.

Next, to the mixture solution, an acrylic resin (manufactured by DIC Corporation: ACRYDIC BL-616-BA) was added and stirred. The weight ratio of fluororesin:acrylic resin was 3:7. Thus, a resin composition was obtained.

The resin composition obtained in this manner was defoamed by stirring, applied onto a 25-μm PET film using a bar coater, and cured by heating with an oven at 80° C. for 1 hour. Thus, a wavelength conversion film was formed.

In the obtained wavelength conversion film, the wavelength conversion layer had a thickness of 79 μm, and the wavelength conversion film as a whole had a thickness of 104 μm.

Example 9

As in Example 1, a wavelength conversion film having a thickness of 56 μm was formed. This film was disposed on a sealant with a blue LED mounted thereon. Thus, an LED device was prepared.

Example 10

As in Example 2, a wavelength conversion film having a thickness of 48 μm was formed. This film was disposed on a sealant with a blue LED mounted thereon. Thus, an LED device was prepared.

Example 11

As in Example 3, a wavelength conversion film having a thickness of 50 μm was formed. This film was disposed on a sealant with a blue LED mounted thereon. Thus, an LED device was prepared.

Example 12

As in Example 4, a wavelength conversion film having a thickness of 41 μm was formed. This film was disposed on a sealant with a blue LED mounted thereon. Thus, an LED device was prepared.

Example 13

The resin composition obtained in Example 5 was applied onto a sealant with a blue LED mounted thereon, and cured by heating at 85° C. for 1 hour. Thus, an LED device was prepared. The formed wavelength conversion material had a thickness of 38 μm.

Example 14

The resin composition obtained in Example 6 was applied onto a sealant with a blue LED mounted thereon, and cured by heating at 85° C. for 1 hour. Thus, an LED device was prepared. The formed wavelength conversion material had a thickness of 34 μm.

Example 15

The resin composition obtained in Example 7 was applied onto a sealant with a blue LED mounted thereon, and cured by heating at 85° C. for 1 hour. Thus, an LED device was prepared. The formed wavelength conversion material had a thickness of 40 μm.

Example 16

The resin composition obtained in Example 8 was applied onto a sealant with a blue LED mounted thereon, and cured by heating at 85° C. for 1 hour. Thus, an LED device was prepared. The formed wavelength conversion material had a thickness of 58 μm.

Comparative Example 1

To an acrylic resin (manufactured by DIC Corporation: ACRYDIC BL-616-BA), QD-G and QD-R were added and stirred. Each of QD-G and QD-R accounted for 2% by mass of the resin solid content. Thus, a resin composition was obtained.

Next, the resin composition was defoamed by stirring, applied onto a 25-μm PET film using a bar coater, heated at 60° C. for 2 hours, then heated at 150° C. for 4 hours, and solidified. Thus, a film having a wavelength conversion layer was formed. Further, a 25-μm PET film was laminated on the wavelength conversion layer. Thus, a laminate film was obtained. This laminate film was heated at 85° C. for 1 hour to cure the wavelength conversion layer. Thus, a wavelength conversion film was obtained.

In the obtained wavelength conversion film, the wavelength conversion layer had a thickness of 81 μm, and the wavelength conversion film as a whole had a thickness of 131 μm.

Comparative Example 2

To an epoxy resin (manufactured by Fine Polymers Corporation: EpiFine T0-0107-20) as a base resin, QD-G and QD-R were added and stirred. Each of QD-G and QD-R accounted for 2% by mass of the resin solid content. Thus, a resin composition was obtained.

Next, the resin composition was defoamed by stirring, and applied onto a 25-μm PET film using a bar coater. Further, a 25-μm PET film was pasted. Thus, a film having a wavelength conversion layer was obtained. This was irradiated with UV using a 365 nm UV LED lamp at 100 W/cm² for 20 seconds to cure the wavelength conversion layer. Thus, a wavelength conversion film was obtained.

In the obtained wavelength conversion film, the wavelength conversion layer had a thickness of 67 μm, and the wavelength conversion film as a whole had a thickness of 117 μm.

Comparative Example 3

To an acrylic resin (manufactured by DIC Corporation: ACRYDIC BL-616-BA) as a base resin, QD-G and QD-R were added and stirred. Each of QD-G and QD-R accounted for 2% by mass of the resin solid content. Thus, a resin composition was obtained.

Next, the resin composition was defoamed by stirring, applied onto a 15-μm barrier film (manufactured by Toppan Printing Co., Ltd.: GL film) using a bar coater, heated at 60° C. for 2 hours, and then heated at 150° C. for 4 hours to solidify the wavelength conversion layer. Thus, a laminate film was formed. Further, a 15-μm barrier film was laminated on the wavelength conversion layer. The resulting film was heated at 85° C. for 1 hour to cure the wavelength conversion layer. Thus, a wavelength conversion film was obtained.

In the obtained wavelength conversion film, the wavelength conversion layer had a thickness of 83 μm, and the wavelength conversion film as a whole had a thickness of 113 μm.

Comparative Example 4

To 20 mL of the quantum-dot solution, 0.2 mL of 3-aminopropyltrimethoxysilane (manufactured by Tokyo Chemical Industry Co., Ltd.) was added and mixed at room temperature for 24 hours. Thus, a quantum-dot mixture solution was obtained.

Next, while the quantum-dot mixture solution was being vigorously stirred, 0.5 mL of tetramethoxysilane (manufactured by Tokyo Chemical Industry Co., Ltd.) was added dropwise thereto. Without interrupting the stirring, 1 mL of 10% ammonia water was added dropwise little by little and stirred for 20 hours for the reaction.

After the reaction, centrifugation was performed. Thus, quantum dots coated with $SiO_2$ layers were obtained.

Next, to an acrylic resin (manufactured by DIC Corporation: ACRYDIC BL-616-BA) as a base resin, QD-G and QD-R were added using the $SiO_2$ layer-coated quantum dots, and stirred. Each of QD-G and QD-R accounted for 2% by mass of the resin solid content. Thus, a resin composition containing the $SiO_2$ layer-coated quantum dots and the acrylic resin was obtained.

Next, the resin composition was defoamed by stirring, applied onto a 25-μm PET film using a bar coater, heated at 60° C. for 2 hours, then heated at 150° C. for 4 hours, and solidified. Thus, a laminate film was formed. Further, a 25-μm PET film was laminated on the wavelength conversion layer. The resulting film was heated at 85° C. for 1 hour to cure the wavelength conversion layer. Thus, a wavelength conversion film was obtained.

In the obtained wavelength conversion film, the wavelength conversion layer had a thickness of 75 μm, and the wavelength conversion film as a whole had a thickness of 125 μm.

Comparative Example 5

The resin composition obtained in Comparative Example 2 was applied onto a sealant with a blue LED mounted thereon, and irradiated with UV using a 365 nm UV LED lamp at 100 W/cm$^2$ for 20 seconds for curing. Thus, an LED device was prepared. The formed wavelength conversion material had a thickness of 50 μm.

Comparative Example 6

To a silicone resin (manufactured by Shin-Etsu Chemical Co., Ltd.: LPS-5547) as a base resin, QD-G and QD-R were added and stirred. Each of QD-G and QD-R accounted for 2% by mass of the resin solid content. Thus, a resin composition was obtained. This resin composition was applied onto a sealant with a blue LED mounted thereon, and cured by heating at 60° C. for 2 hours. Thus, an LED device was prepared. The formed wavelength conversion material had a thickness of 58 μm.

Comparative Example 7

To an epoxy resin (manufactured by Electric Materials Inc.: OPTOCAST 3553) as a base resin, QD-G and QD-R were added using the quantum dots obtained in Comparative Example 4, and stirred. Each of QD-G and QD-R accounted for 2% by mass of the resin solid content. Thus, a resin composition containing the $SiO_2$ layer-coated quantum dots and the acrylic resin was obtained.

This resin composition was applied onto a sealant with a blue LED mounted thereon, and irradiated with UV using a 365 nm UV LED lamp at 100 W/cm$^2$ for 20 seconds for curing. Thus, an LED device was prepared. The formed wavelength conversion material had a thickness of 51 μm.

First, the initial luminous properties of the wavelength conversion films prepared in Examples 1 to 8 and Comparative Examples 1 to 4 were measured. Then, the luminous properties were evaluated again after storage under high-temperature high-humidity conditions (temperature: 85 degrees, humidity: 85%, storage time: 250 hours).

Based on the quantum yields in the initial light emission, changes in relative magnitudes of quantum yields after the high-temperature high-humidity treatment were evaluated according to criteria shown in Table 1 below. Note that, in evaluating the fluorescence properties of the wavelength conversion films, Quantum Efficiency Measurement System (QE-2100 manufactured by Otsuka Electronics Co., Ltd.) was used to measure the luminous properties with an excitation wavelength being set at 450 nm. Moreover, the measurement was performed at two locations: an end portion of the film; and an inner portion that was 5 cm away from the end portion.

TABLE 1

| Relative variation | Evaluation result |
| --- | --- |
| less than 5% | A |
| 5% or more and less than 10% | B |
| 10% or more and less than 20% | C |
| 20% or more | D |

Table 2 shows the contents of the resin compositions and the structures of the wavelength conversion films of Examples 1 to 8 and Comparative Examples 1 to 4, as well as the evaluation results of the luminous properties. Note that, regarding the measurement location, the film end portion was designated by "1", and the inner portion 5 cm away from the end portion was designated by "2".

TABLE 2

| Luminous properties | Resin composition | | | Structure of wavelength conversion film | Evaluation result Measurement location | |
| --- | --- | --- | --- | --- | --- | --- |
| | Quantum dots | Base resin | Additive | | 1 | 2 |
| Example 1 | QD-G + QD-R | tetrafluoroethylene-ethylene copolymer (ETFE) | — | wavelength conversion layer (monolayer) | A | A |
| Example 2 | QD-G + QD-R | perfluoroalkoxy alkane(PFA) | — | wavelength conversion layer (monolayer) | A | A |

TABLE 2-continued

| Luminous properties | Resin composition | | | Structure of wavelength conversion film | Evaluation result Measurement location | |
|---|---|---|---|---|---|---|
| | Quantum dots | Base resin | Additive | | 1 | 2 |
| Example 3 | QD-G + QD-R | polychlorotrifluoro-ethylene(PCTFE) | — | wavelength conversion layer (monolayer) | A | A |
| Example 4 | QD-G + QD-R | polyvinylidene fluoride(PVDF) | — | wavelength conversion layer (monolayer) | A | A |
| Example 5 | QD-G + QD-R | polyvinylidene fluoride(PVDF) | — | PET/wavelength conversion layer/PET | A | A |
| Example 6 | QD-G + QD-R | fluoroethylene-vinyl ether copolymer | — | wavelength conversion layer/PET | A | A |
| Example 7 | QD-G + QD-R | fluoroethylene-vinyl ether copolymer | silica particles | wavelength conversion layer/PET | A | A |
| Example 8 | QD-G + QD-R | fluoroethylene-vinyl ether copolymer + acrylic resin | — | wavelength conversion layer/PET | A | A |
| Comparative Example 1 | QD-G + QD-R | acrylic resin | — | PET/wavelength conversion layer/PET | D | C |
| Comparative Example 2 | QD-G + QD-R | epoxy resin | — | PET/wavelength conversion layer/PET | B | B |
| Comparative Example 3 | QD-G + QD-R | acrylic resin | — | barrier/wavelength conversion layer/barrier | B | A |
| Comparative Example 4 | QD-G + QD-R SiO$_2$ coat | acrylic resin | — | PET/wavelength conversion layer/PET | C | B |

It was revealed that incorporating the fluorine-containing resins in the base resins as in Examples 1 to 8 successfully suppressed quantum dot degradation, and highly reliable wavelength conversion films with stable properties were obtained.

Meanwhile, if the base resins contained no fluorine-containing resin as in Comparative Examples 1 to 4, the stabilities were poorer than those of Examples. Particularly, when no measure for the stability of the quantum dots was devised as in Comparative Examples 1 and 2, the relative variations in the luminous properties were large, and the properties were significantly unstable. In Comparative Example 3, the wavelength conversion film was sandwiched by the barrier films in order to make the quantum dots stable, but the stability was insufficient. In Comparative Example 4, the quantum dot surfaces were coated for the stability enhancement, but the luminous properties of the quantum dots did not last, and the properties were degraded.

Next, the LED devices prepared in Examples 9 to 16 and Comparative Examples 5 to 7 were evaluated. First, the initial luminous properties were measured. Then, the luminous properties were evaluated again after light was emitted continuously for 1000 hours while a current of 20 mA was allowed to flow. Based on the emission intensities in the initial light emission, relative variations in the emission intensities after the 1000-hour light emission were evaluated according to the criteria in Table 1. Table 3 shows the evaluation results of the luminous properties of Examples 9 to 16 and Comparative Example 5 to 7.

TABLE 3

| LED luminous properties | Resin composition | | | Evaluation result |
|---|---|---|---|---|
| | Quantum dots | Base resin | Additive | |
| Example 9 | QD-G + QD-R | tetrafluoroethylene-ethylene copolymer (ETFE) | — | A |
| Example 10 | QD-G + QD-R | perfluoroalkoxy alkane(PFA) | — | A |
| Example 11 | QD-G + QD-R | polychlorotrifluoro-ethylene(PCTFE) | — | A |
| Example 12 | QD-G + QD-R | polyvinylidene fluoride(PVDF) | — | A |
| Example 13 | QD-G + QD-R | polyvinylidene fluoride(PVDF) | — | A |
| Example 14 | QD-G + QD-R | fluoroethylene-vinyl ether copolymer | — | A |
| Example 15 | QD-G + QD-R | fluoroethylene-vinyl ether copolymer | silica particles | A |
| Example 16 | QD-G + QD-R | fluoroethylene-vinyl ether copolymer + acrylic resin | — | A |
| Comparative Example 5 | QD-G + QD-R | epoxy resin | — | D |
| Comparative Example 6 | QD-G + QD-R | silicone resin | — | C |
| Comparative Example 7 | QD-G + QD-R SiO$_2$ coat | epoxy resin | — | B |

It was revealed that incorporating the fluorine-containing resins in the base resins as in Examples 9 to 16 successfully suppressed quantum dot degradation, and highly reliable LED devices with stable luminous properties were obtained.

Meanwhile, if the base resins contained no fluorine-containing resin as in Comparative Examples 5 to 7, the LED devices had inferior stability of luminous properties to those of Examples. Particularly, when no measure for the stability of the quantum dots was devised as in Comparative Examples 5 and 6, the relative variations in the luminous properties were large, and the properties were significantly unstable. In Comparative Example 7, even though the quantum dot surfaces were coated for the stability enhancement, the luminous properties of the quantum dots did not last, and the luminous properties of the LED were degraded.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A resin composition comprising:
   a base resin comprising:
      a fluorine-containing resin; and
      a fluorine-free resin; and
   quantum dots that are crystalline nanoparticle phosphors,
   wherein the fluorine-containing resin is a polymer selected from perfluoroalkoxy alkane, tetrafluoroethylene-perfluoropropylene copolymer, tetrafluoroethylene-perfluoroalkyl vinyl ether copolymer, fluoroethylene-vinyl ether copolymer, chlorotrifluoroethylene-ethylene copolymer, fluoroolefin-acrylic acid ester copolymer, tetrafluoroethylene-perfluorodioxole copolymer, and derivatives thereof.

2. The resin composition according to claim 1, wherein the fluorine-free resin includes at least one or more resins selected from an acrylic resin, an epoxy resin, a silicone resin, a urethane resin, and a polyimide resin.

3. A wavelength conversion material formed from the resin composition according to claim 1.

4. The wavelength conversion material according to claim 3, wherein the wavelength conversion material is a wavelength conversion material for LED.

5. A wavelength conversion film comprising a wavelength conversion layer formed from the resin composition according to claim 1.

6. The wavelength conversion film according to claim 5, wherein the fluorine-containing resin and the fluorine-free resin are phase-separated at least partially.

7. The wavelength conversion film according to claim 5, wherein the wavelength conversion film comprises a single layer of the wavelength conversion layer.

8. The wavelength conversion film according to claim 5, wherein the wavelength conversion film has a laminate structure comprising the wavelength conversion layer and transparent films on both sides of the wavelength conversion layer.

9. The wavelength conversion film according to claim 5, wherein the wavelength conversion film is a wavelength conversion film for LED.

10. An LED device comprising the wavelength conversion material according to claim 4.

11. An LED device comprising the wavelength conversion film according to claim 9.

12. A backlight unit comprising the wavelength conversion film according to claim 5.

13. A backlight unit comprising the LED device according to claim 10.

14. An image display apparatus comprising the wavelength conversion film according to claim 5.

15. An image display apparatus comprising the backlight unit according to claim 12.

* * * * *